(12) United States Patent
Nakashiba

(10) Patent No.: US 6,872,584 B2
(45) Date of Patent: Mar. 29, 2005

(54) SOLID STATE IMAGE SENSOR AND METHOD FOR FABRICATING THE SAME

(75) Inventor: Yasutaka Nakashiba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 81 days.

(21) Appl. No.: 10/246,688

(22) Filed: Sep. 19, 2002

(65) Prior Publication Data

US 2003/0022413 A1 Jan. 30, 2003

Related U.S. Application Data

(62) Division of application No. 09/665,903, filed on Sep. 20, 2000, now Pat. No. 6,472,698.

(30) Foreign Application Priority Data

Sep. 21, 1999 (JP) ............................................ 11-267338

(51) Int. Cl.[7] .............................................. H01L 21/00
(52) U.S. Cl. .............................. 438/22; 438/24; 438/25; 438/26; 438/48; 438/64
(58) Field of Search ............................. 438/22, 24–27, 438/48, 64; 257/72, 98, 222

(56) References Cited

U.S. PATENT DOCUMENTS

| 5,451,977 | A | | 9/1995 | Kusuda et al. | |
|---|---|---|---|---|---|
| 6,081,018 | A | * | 6/2000 | Nakashiba et al. | 257/435 |
| 6,252,285 | B1 | * | 6/2001 | Furumiya et al. | 257/432 |
| 6,618,087 | B1 | * | 9/2003 | Hokari et al. | 348/311 |

FOREIGN PATENT DOCUMENTS

| JP | 4-352471 | 12/1992 |
|---|---|---|
| JP | 8-330557 | 12/1996 |
| JP | 11-163129 | 6/1999 |

* cited by examiner

Primary Examiner—Hsien-Ming Lee
(74) Attorney, Agent, or Firm—McGinn & Gibb, PLLC

(57) ABSTRACT

In a solid state image sensor having micro lenses, the micro lens and a bonding pad electrode are formed on a planarizing layer. Thus, it is no longer necessary to etch the planarizing layer for exposing the bonding pad under the planarizing layer, by use of a photolithography, and therefore, it is possible to avoid dissolution, deform and detachment of the micro lens, which would have otherwise been caused in the prior art by dissolving a photoresist which was used in the photolithography.

12 Claims, 12 Drawing Sheets

SOLID STATE IMAGE SENSOR AND METHOD FOR FABRICATING THE SAME

This application is a Divisional of U.S. Ser. No. 09/665,903 filed Sep. 20, 2000, now U.S. Pat. No. 6,472,698.

BACKGROUND OF THE INVENTION

The present invention relates to a structure and a fabricating method of a solid state image sensor having micro lenses.

A conventional solid state image sensor of the type having a transfer layer for transferring a signal charge obtained by a photo-electric conversion, is generally classified into a MOS type and a CCD type. This solid state image sensor, particularly the CCD type solid state image sensor is recently widely used in a single-unit video-camera recorder, a digital camera, a facsimile, etc., and, at present, technology development is still continuously attempted for elevating the characteristics.

The CCD type solid state image sensor includes a photoelectric conversion section, namely, an image sensor section, which is constituted by arranging in a two-dimensional array a number of photoelectric conversion elements corresponding to pixels. Signal charges obtained in the photoelectric conversion section are read out in order through a vertically transferring CCD and a horizontally transferring CCD, so that a signal of each pixel is read out sequentially.

On the other hand, a CMOS type solid state image sensor does not utilize a CCD for the vertical transfer and the horizontal transfer, but is configured to read from a selected pixel through a selection line formed of an aluminum interconnection as in a memory device.

Furthermore, the CCD type solid state image sensor needs a plurality of power supply voltages including a positive power supply voltage and a negative power supply voltage, but the CMOS type solid state image sensor can be driven with a single power supply voltage, and therefore, can be operated with a power consumption and a power voltage which are lower than those required in the CCD type solid state image sensor.

In addition, since the CCD type solid state image sensor is fabricated with an inherent fabricating process, it is difficult to apply a CMOS circuit fabricating process with no modification. On the other hand, since the CMOS type solid state image sensor can be fabricated with the CMOS circuit fabricating process, it can be formed simultaneously together with a logic circuit, an analog circuit, an analog-to-digital converting circuit and others, by means of a CMOS process which is widely used in a processor, a semiconductor memory such as a DRAM, and a logic circuit. Accordingly, the CMOS type solid state image sensor can be formed together with the semiconductor memory and the processor on the same semiconductor chip, and can be fabricated in a production line in common to the semiconductor memory and the processor.

A conventional basic cell in an image sensor section and a portion of a logic circuit section in the above mentioned CMOS type solid state image sensor will be now shown in FIG. 4B as a first prior art example.

Referring to FIG. 4B, the reference number 1 designates a P-type silicon substrate, and the reference number 2 indicates a first P-well in the image sensor section. The reference number 3 denotes a second P-well in a CMOS circuit section, and the reference number 4 shows an N-well in the CMOS circuit section. The reference number 5 designates an N-type diffused layer which constitutes a photodiode in the image sensor section, and the reference number 6 indicates a P$^+$ diffused layer. The reference number 7 denotes an N$^+$ diffused layer, and the reference number 8 shows a gate electrode. The reference number 9 designates a first level metal interconnection, and the reference number 10 indicates a second level metal interconnection. The reference number 13 denotes an insulating film, and the reference number 31 shows a third level metal interconnection constituting a light block film having an opening through which an incident light passes. The reference number 43 designates an insulating film, and the reference number 34 indicates a planarizing layer formed of a transparent resin. The reference number 35 denotes a micro lens 35.

The basic cell in the image sensor section of the CMOS type solid state image sensor is illustrated in FIGS. 6A and 6B. In FIGS. 6A and 6B, the reference number 51 designates a controlling MOSFET, and the reference number 52 indicates a MOSFET of a source follower amplifier. The reference number 53 denotes a horizontal selection switch MOSFET, and the reference number 54 shows a load MOSFET of the source follower amplifier. Elements designated with the same references numbers as those used in FIG. 4B corresponds to those given with the same reference numbers in FIG. 4B.

The CMOS type solid state image sensor having the above mentioned structure operates as follows:

First, as shown in FIG. 6A, a pulse $\phi_R$ of a high level is applied to a gate of the controlling MOSFET 51, so that a potential of the N-type diffused layer 5 constituting the photodiode of the image sensor section is set to a power supply voltage $V_{DD}$, whereby a signal charge in the N-type diffused layer 5 is reset.

Then, as shown in FIG. 6B, the pulse $\phi_R$ of a low level is applied to the gate of the controlling MOSFET 51, in order to prevent a blooming.

In the process of a signal charge accumulation, if electron-hole pairs are generated in a region under the N-type diffused layer 5 (constituting the photodiode of the image sensor section) in response to an incident light, electrons are accumulated in a depletion layer of the N-type diffused layer 5, and on the other hand, the holes are exhausted through the first P-well 2. Here, a region hatched with a grill-work pattern in FIG. 6B, having a potential deeper than the power supply voltage $V_{DD}$, indicates that the region does not become the depletion layer. Between the depletion layer formed in the first P-well 2 under the N-type diffused layer 5 and the N$^+$ diffused layer 7 applied with the power supply voltage $V_{DD}$, a potential barrier is created by the controlling MOSFET 51, so that the electrons are accumulated under the N-type diffused layer 5 in the process of the signal charge accumulation as shown in FIG. 6B.

Succeedingly, the potential of the N-type diffused layer 5 varies upon the number of the accumulated electrons. This potential variation is outputted to a drain of the horizontal selection switch MOSFET 53 through the MOSFET 52 of the source follower amplifier in a source follower operation, and finally is outputted from an output terminal $V_{OUT}$ of the source follower amplifier. Thus, a photoelectric conversion characteristics having an excellent linearity can be obtained.

Now, a method for fabricating the above mentioned CMOS type solid state image sensor will be described with reference to FIGS. 3A, 3B, 4A and 4B.

First, the first P-well 2, the second P-well 3 and the N-well 4 are selectively formed on a principal surface of the P-type silicon substrate 1. Succeedingly, the N-type diffused layer 5 (constituting the photodiode of the image sensor section), the P$^+$ diffused layer 6, the N$^+$ diffused layer 7 and the gate electrode 8 are formed as shown, by means of well-known photolithography, dry-etching and ion implantation.

Then, the first metal interconnection 9 and the second metal interconnection 10 (for supplying a pulse or a voltage or for outputting a signal to or from the N-type diffused layer 5 (constituting the photodiode of the image sensor section), the P$^+$ diffused layer 6, the N$^+$ diffused layer 7 and the gate electrode 8) are formed through the insulating film 13. Furthermore, the third metal interconnection 31 (constituting the light blocking film having the opening above the N-type diffused layer 5, and a bonding pad 36) is formed. In the shown example, the third metal interconnection 31 constituting the light blocking film is formed as an uppermost level interconnection, but the position of the third metal interconnection 31 is not limited to only this level. For example, the third metal interconnection 31 can be formed on a lower level interlayer insulator film of a plurality of interlayer insulator films constituting the insulating film 13.

Thereafter, in order to prevent corrosion of the metal interconnection, an oxide film is deposited to have a thickness of 200 nm by a CVD (chemical vapor deposition) process, so as to form the insulating film 43.

Succeedingly, a sintering is carried out at a temperature on the order of 450° C. for the purpose of activating a contacting portion between the metal interconnection and the diffused layer and the gate electrode, and also for the purpose of reducing an interface state between a silicon of the N-type diffused layer 5 (constituting the photodiode in the image sensor section) and an oxide film. Furthermore, a portion of the insulating film 43 above the bonding pad 36 at an end of the metal interconnection is selectively removed by a wet etching. This condition is shown in FIG. 3A.

Then, a transparent resin is coated by a spin coating, and thermally cured to form the planarizing layer 34 formed of a thick transparent resin and having a thickness on the order of 4 μm. This condition is shown in FIG. 3B.

Thereafter, a photosensitive resin is coated on the planarizing layer 34 by the spin coating to have a thickness on the order of 2 μm, and is patterned by a photolithography, and then, softened by a heat treatment so as to form the micro lens 35. This condition is shown in FIG. 4A.

Finally, a portion of the planarizing layer 34 above the bonding pad 36 is selectively removed by a dry etching using a photosensitive resist as a mask. Thus, the first prior art example of the solid state image sensor as shown in FIG. 4B is obtained.

In this first prior art example of the solid state image sensor as shown in FIG. 4B, however, the interface state that was reduced by the sintering for the image sensor section, elevates again because of the dry etching for exposing the bonding pad 36, with the result that a dark noise level and a white defect increase.

In order to overcome this problem, Japanese Patent Application Pre-examination Publication No. JP-A-08-330557 proposes the following structure, which will be now described as a second prior art example with FIGS. 5A to 5C.

The second prior art example is the same as the first prior art example until the third metal interconnection 31 (constituting the light blocking film having the opening above the N-type diffused layer 5, and the bonding pad 36) is formed as shown in FIG. 3A. Therefore, in FIGS. 5A to 5C, elements corresponding to those shown in FIG. 3A are given the same reference numbers, and explanation will be omitted.

After the third metal interconnection 31 is formed, an oxide film is deposited on the whole surface to have a thickness on the order of 4.5 μm, by means of the CVD process, and then, the surface of the deposited oxide film is polished and planarized by a CMP (chemical mechanical polishing) process until the thickness of the oxide film becomes on the order of 4 μm, so that a planarizing layer 44 is formed. Succeedingly, a sintering is carried out at a temperature on the order of 450° C. for the purpose of activating a contacting portion between the metal interconnection and the diffused layer and the gate electrode, and also for the purpose of reducing an interface state between a silicon of the N-type diffused layer 5 (constituting the photodiode in the image sensor section) and an oxide film. This condition is shown in FIG. 5A.

Thereafter, a photosensitive polymer resin is coated on the planarizing layer 44 by the spin coating to have a thickness on the order of 2 μm, and is patterned by a photolithography, and then, softened by a heat treatment so as to form the micro lens 45 formed of the polymer resin above the N-type diffused layer 5. This condition is shown in FIG. 5B.

Finally, a portion of the planarizing layer 44 above the bonding pad 36 is selectively removed by a wet etching using a patterned resist as a mask, so that the third metal interconnection 31 constituting the bonding pad 36 is exposed. Thus, the second prior art example of the solid state image sensor as shown in FIG. 5C is obtained.

In the second prior art example of the solid state image sensor as mentioned above, after the micro lens is formed, the portion of the planarizing layer 44 above the bonding pad 36 is selectively removed by the wet etching using the photoresist which was patterned by a photolithography. Therefore, after the wet etching is completed, the patterned photoresist that was used as the mask in the wet etching, is removed by solvent. As a result, another problem is encountered in that the micro lens is dissolved, deformed or detached off by the solvent used for removing the patterned photoresist.

BRIEF SUMMARY OF THE INVENTION

Accordingly, it is an object of the present invention to provide a structure and a fabricating method of a solid state image sensor having micro lenses, which have overcome the above mentioned problem of the prior art.

Another object of the present invention is to provide a structure and a fabricating method of a solid state image sensor having micro lenses, capable of minimizing dissolution, deform and detachment of the micro lens.

The above and other objects of the present invention are achieved in accordance with the present invention by a solid state image sensor comprising a substrate having devices including an image sensor section formed thereon, an insulating film covering the devices, a light blocking film formed at a predetermined height in a range from a surface of the insulating film to a level within the insulating film, the light blocking film having an opening at a position corresponding to at least the image sensor section, a planarizing film covering the insulating film including the light blocking film, a groove formed in a predetermined region of the light blocking film, a bonding electrode filled in the groove and having a surface planarized with a surface of the planarizing film, and a micro lens formed on the planarizing film at a position corresponding to the image sensor section.

According to a second aspect of the present invention, there is provided a solid state image sensor comprising a substrate having devices including an image sensor section formed thereon, an insulating film covering the devices, a light blocking film formed at a predetermined height in a range from a surface of the insulating film to a level within the insulating film, the light blocking film having an opening at a position corresponding to at least the image sensor section, a planarizing film covering the insulating film including the light blocking film, a bonding metal electrode formed on the planarizing film, and a micro lens formed on the planarizing film at a position corresponding to the image sensor section.

In the solid state image sensor in accordance with the first and second aspects of the present invention, the planarizing film can be formed of an inorganic film.

According to a third aspect of the present invention, there is provided a method for fabricating a solid state image sensor, comprising the steps of preparing a substrate having devices including an image sensor section formed thereon, forming an insulating film covering the devices and a light blocking film positioned at a predetermined height in a range from a surface of the insulating film to a level within the insulating film, the light blocking film having an opening at a position corresponding to at least the image sensor section, forming a planarizing film to cover the insulating film including the light blocking film, forming a groove in a predetermined region of the light blocking film, filing the groove with a bonding metal electrode, planarizing the whole surface of the planarizing film including the bonding metal electrode, and forming a micro lens on the planarizing film at a position corresponding to the image sensor section.

Preferably, the step of filing up the bonding metal electrode in the groove and planarizing the whole surface of the planarizing film, includes depositing a metal of the bonding metal electrode on the planarizing film including the groove, and polishing the metal of the bonding metal electrode until the metal of the bonding metal electrode is removed from a surface of the planarizing film.

According to a fourth aspect of the present invention, there is provided a method for fabricating a solid state image sensor, comprising the steps of preparing a substrate having devices including an image sensor section formed thereon, forming an insulating film covering the devices and a light blocking film positioned at a predetermined height in a range from a surface of the insulating film to a level within the insulating film, the light blocking film having an opening at a position corresponding to at least the image sensor section, forming a planarizing film to cover the insulating film including the light blocking film, forming a bonding metal electrode on a predetermined position of the planarizing film, and forming a micro lens on the planarizing film at a position corresponding to the image sensor section.

In the methods in accordance with the third and fourth aspects of the present invention for fabricating the solid state image sensor, a sintering can be carried out after the step of forming the bonding metal electrode but before the step of forming the micro lens.

The above and other objects, features and advantages of the present invention will be apparent from the following description of preferred embodiments of the invention with reference to the accompanying drawings.

DETAILED DESCRIPTION OF THE INVENTION

Figure 1A:
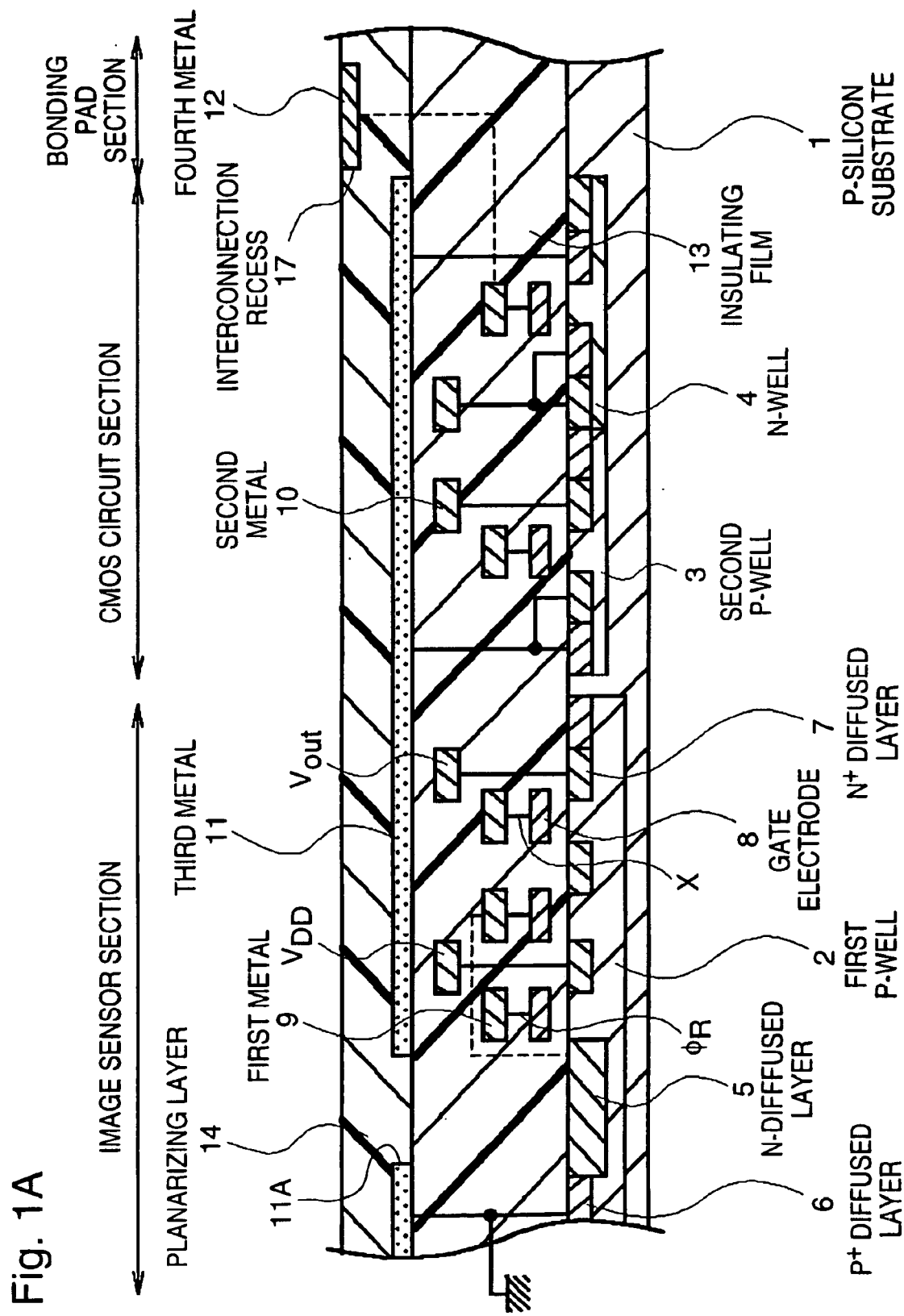
FIGS. 1A and 1B are diagrammatic partial sectional views of the solid state image sensor for illustrating a first embodiment of the method in accordance with the present invention for fabricating the solid state image sensor.
Figure 1B:
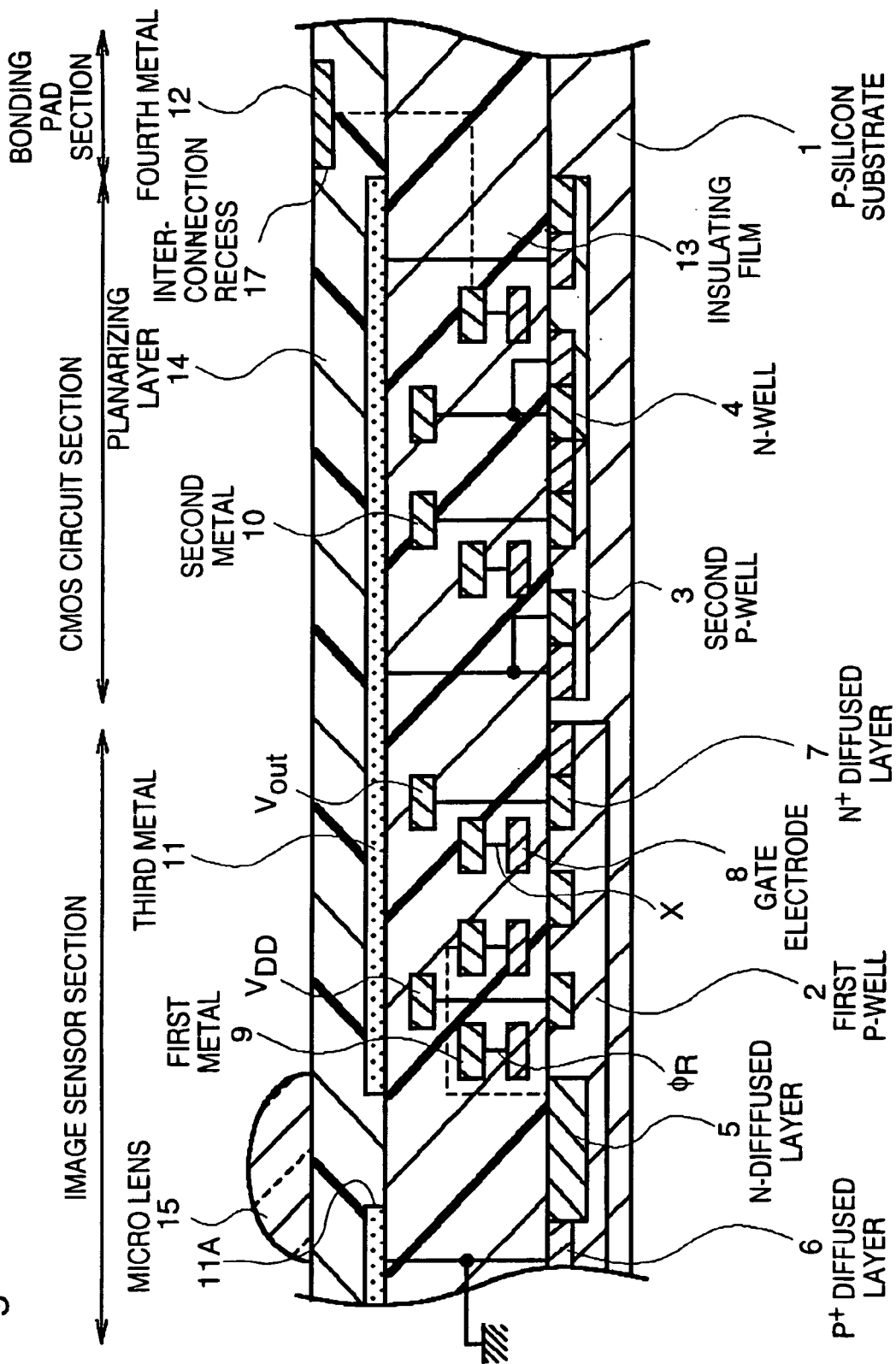
Figure 3A:
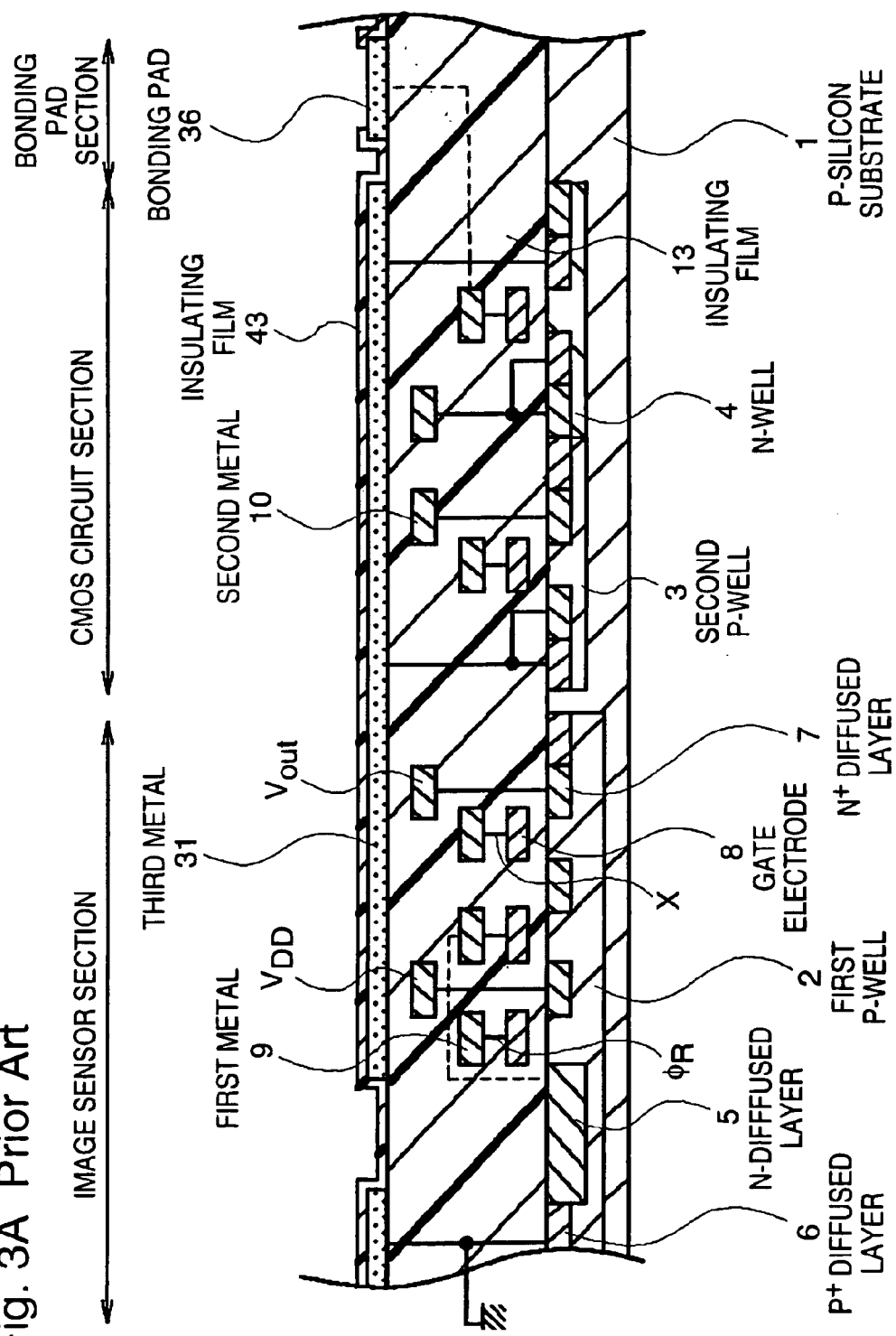
FIGS. 3A and 3B are diagrammatic partial sectional views of the solid state image sensor for illustrating the first example of the prior art method for fabricating the solid state image sensor.
Figure 3B:
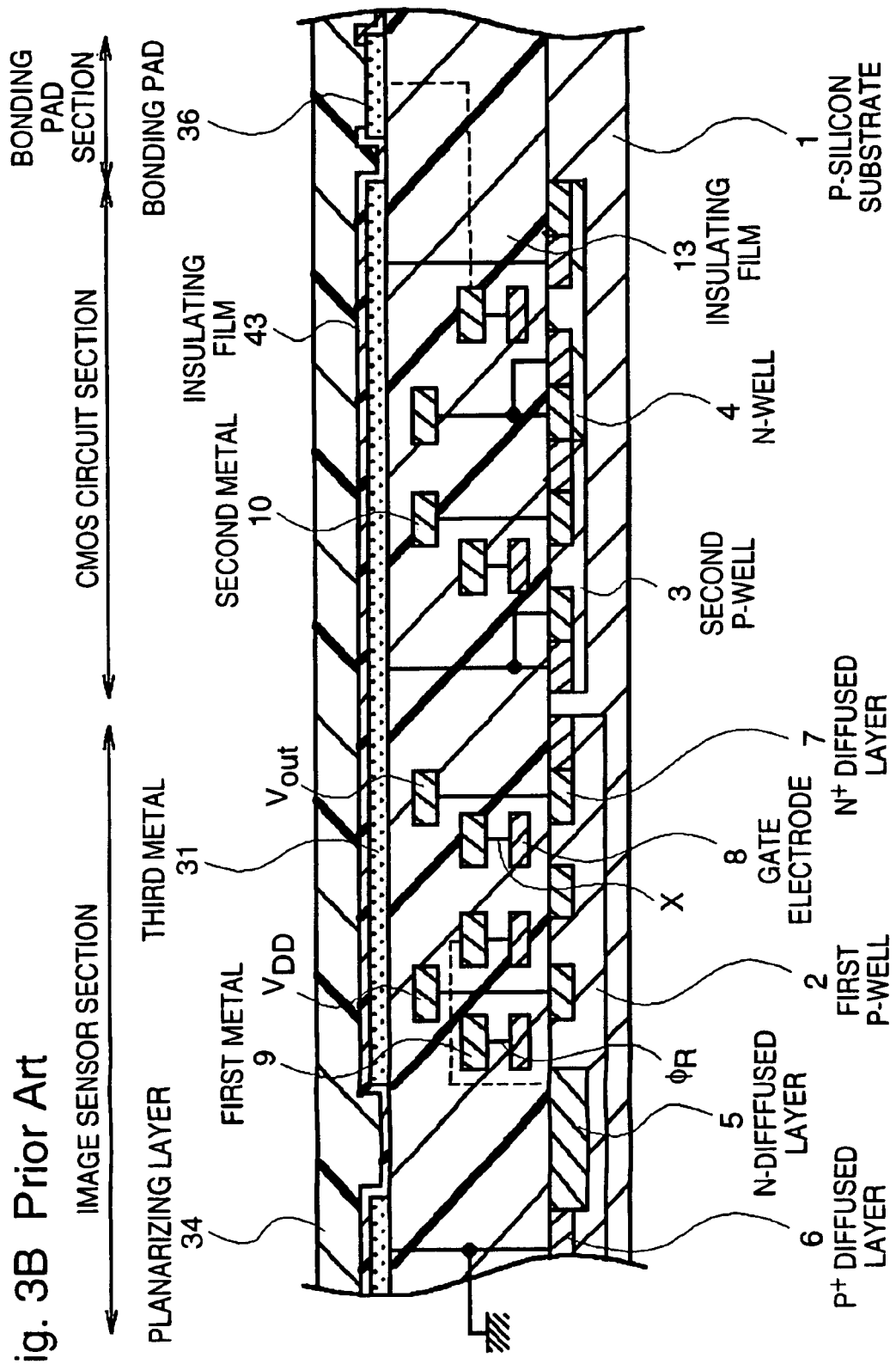
Figure 4A:
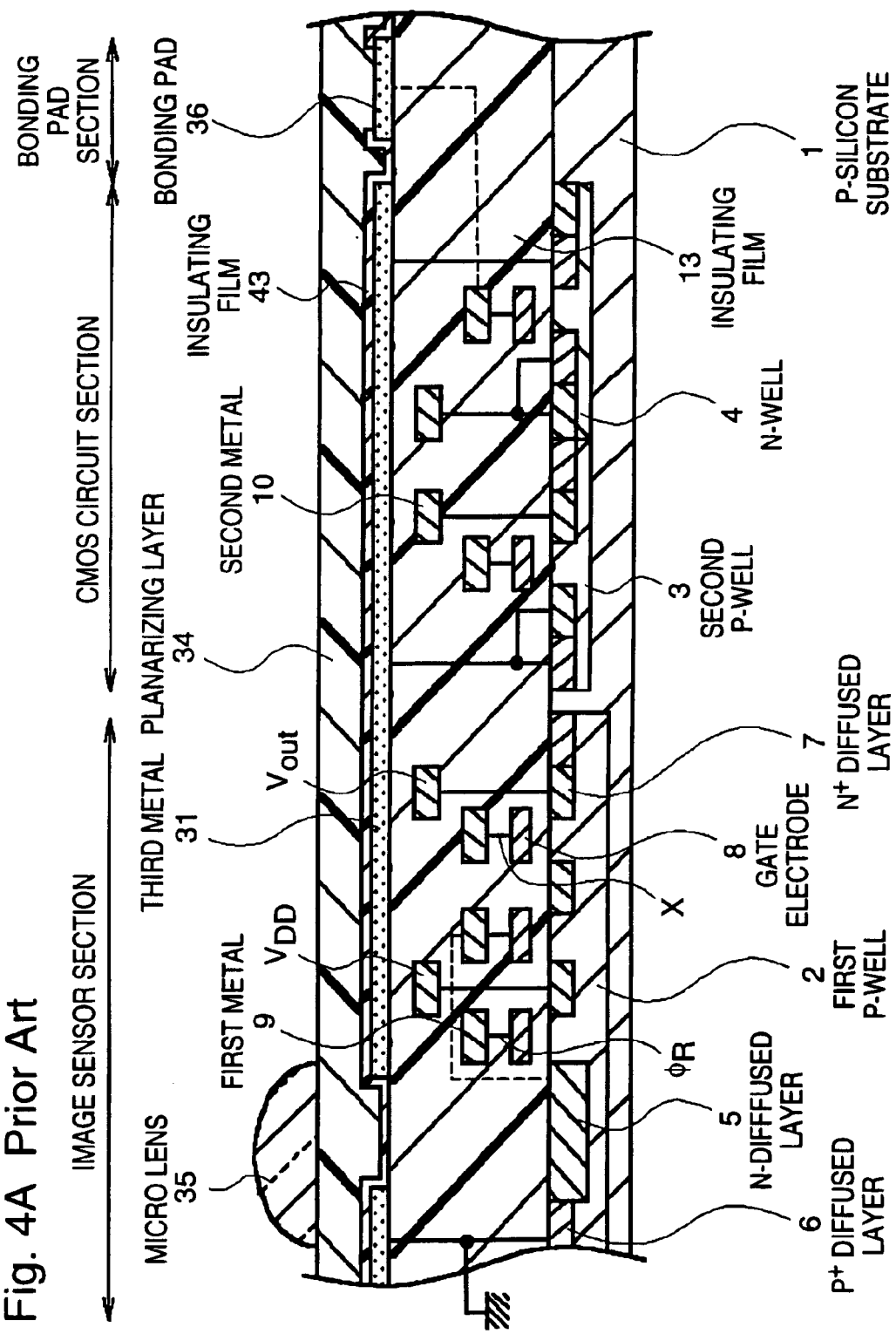
FIGS. 4A and 4B are diagrammatic partial sectional views of the solid state image sensor for illustrating the process succeeding to the process shown in FIG. 3B.
Figure 4B:
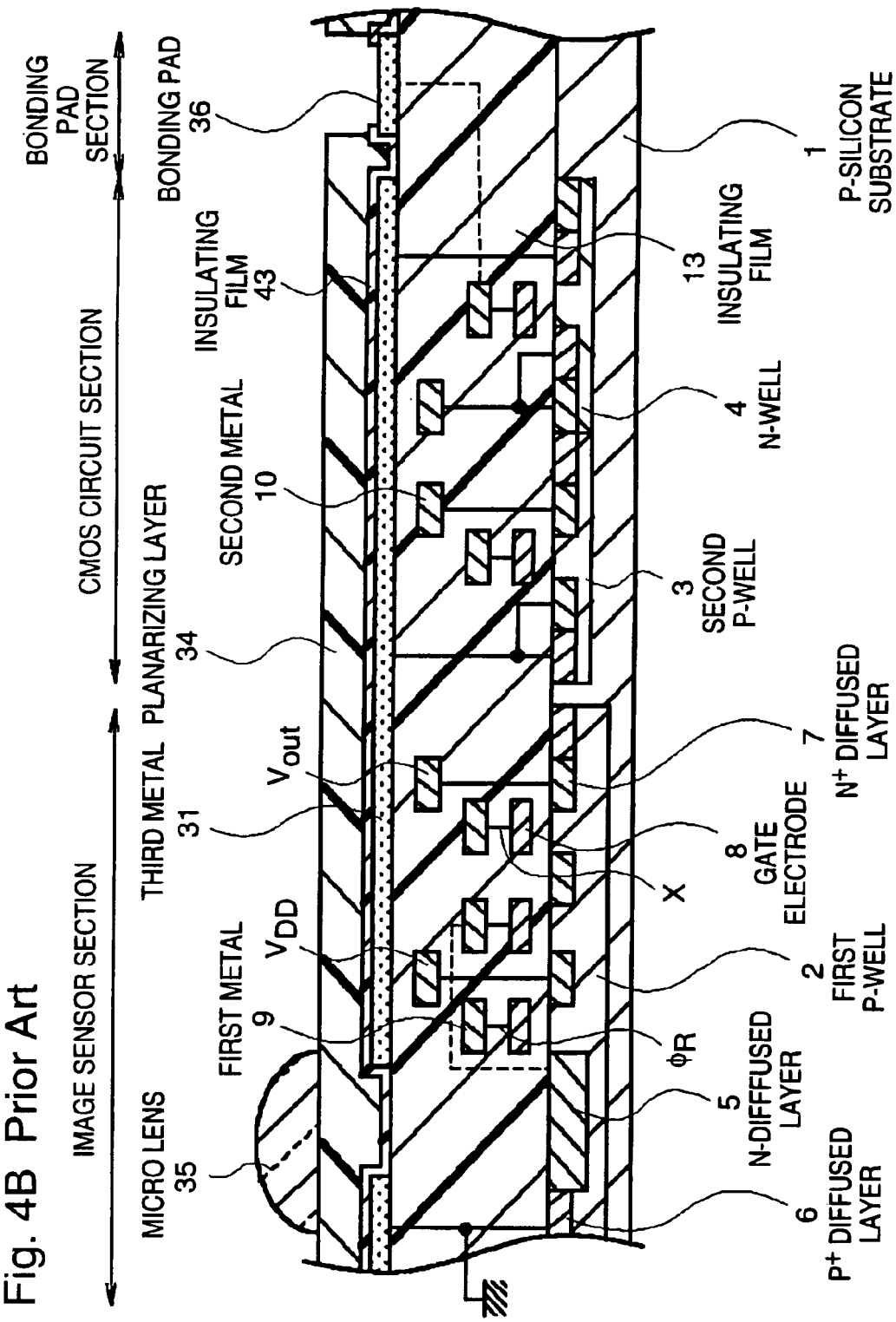
Figure 5A:
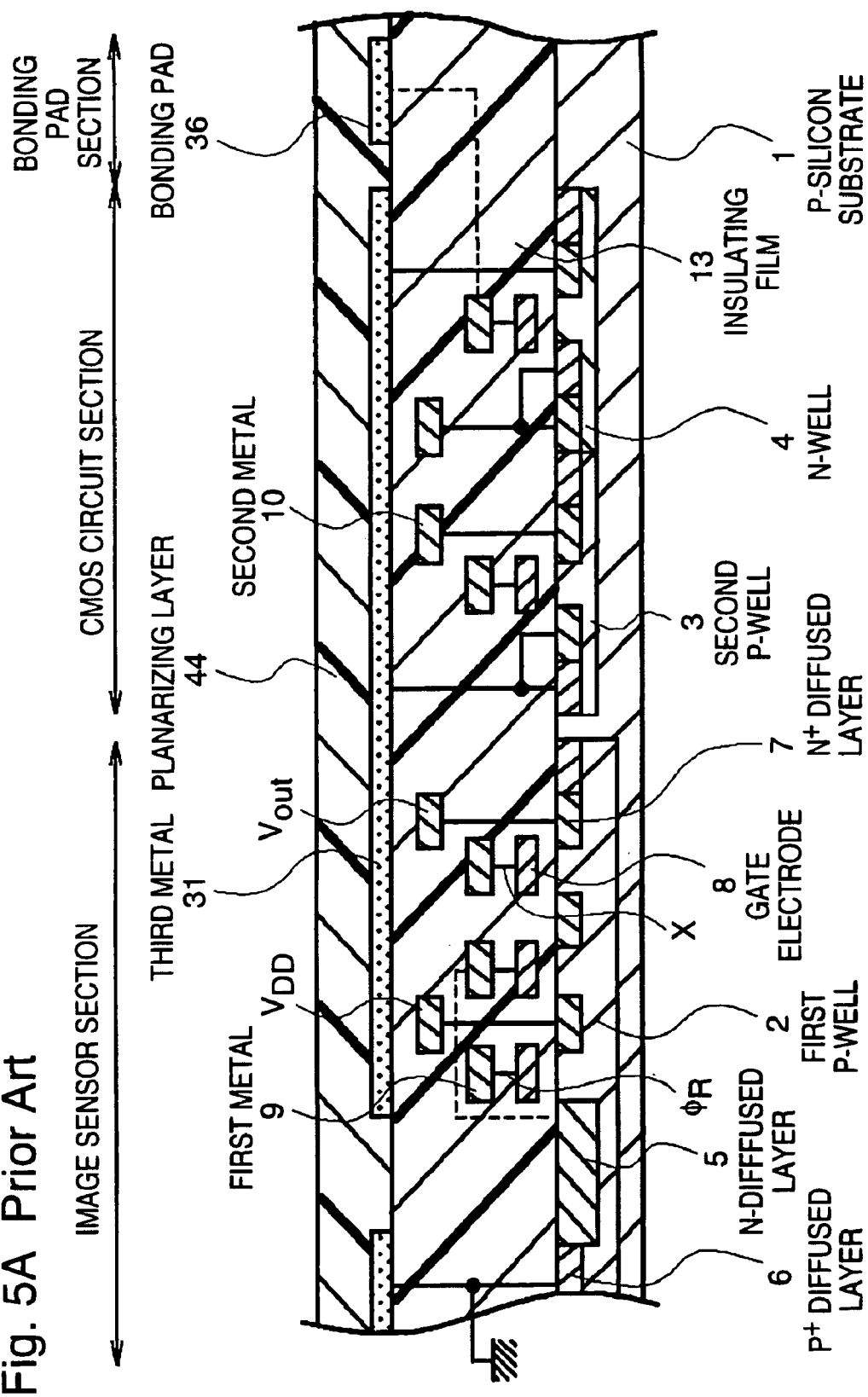
FIGS. 5A, 5B and 5C are diagrammatic partial sectional views of the solid state image sensor for illustrating the second example of the prior art method for fabricating the solid state image sensor.
Figure 5B:
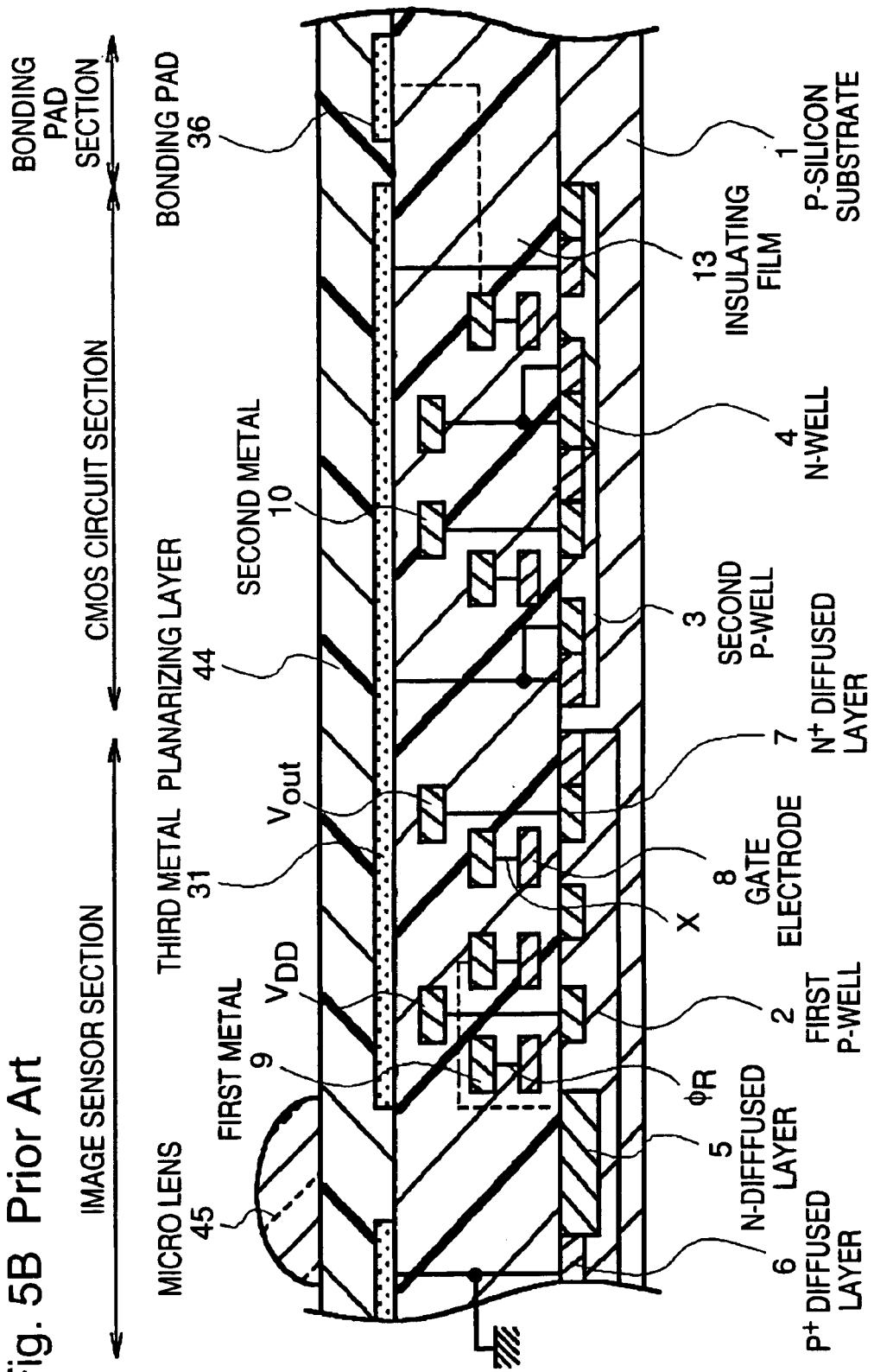
Figure 5C:
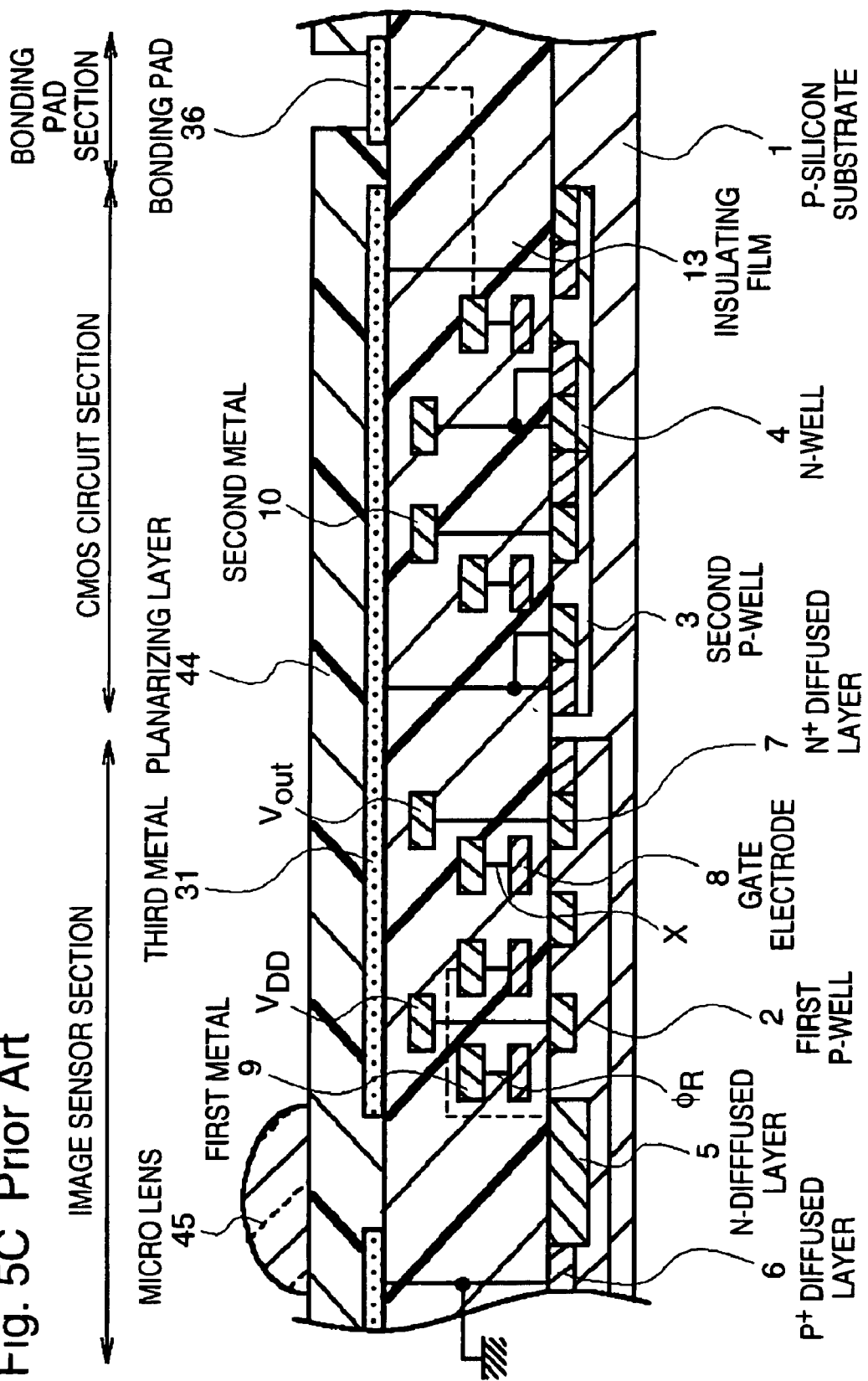
Figure 6A:
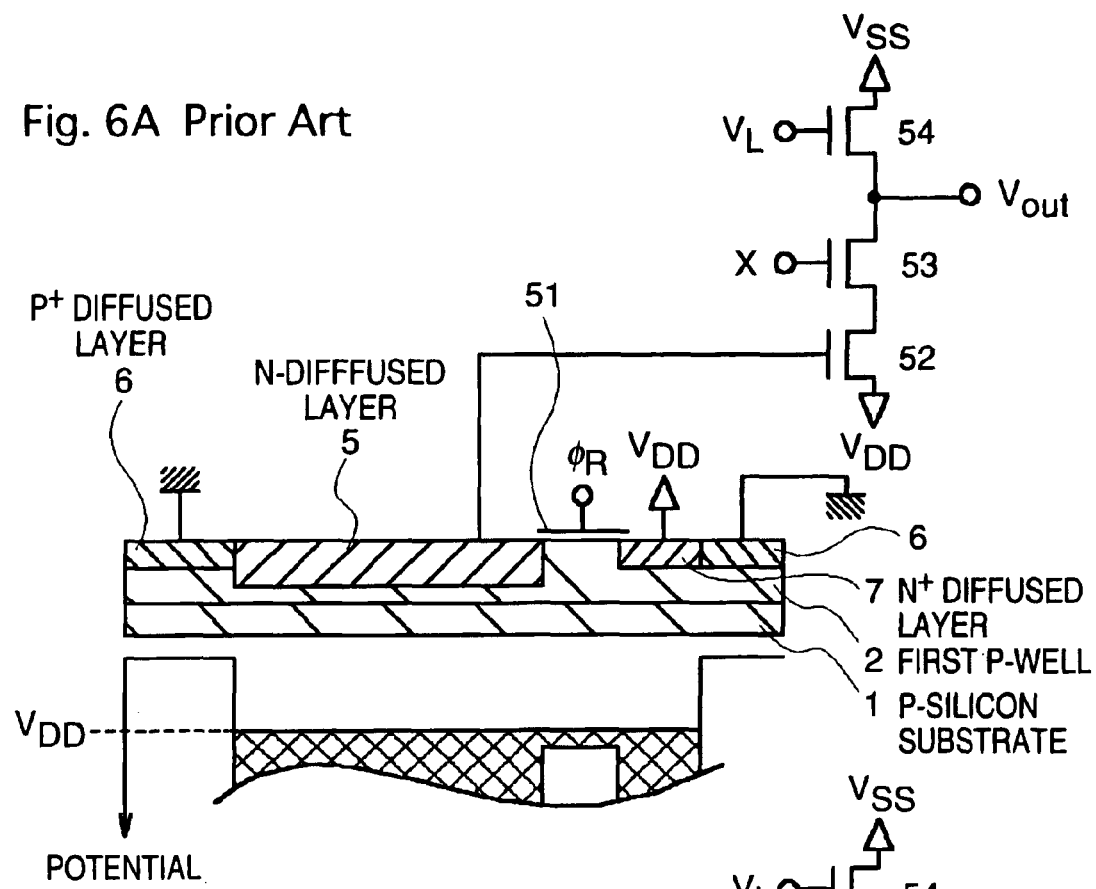
FIGS. 6A and 6B are diagrammatic circuit diagrams for illustrating the circuit construction and the operation of the CMOS type solid state image sensor.
Figure 6B:
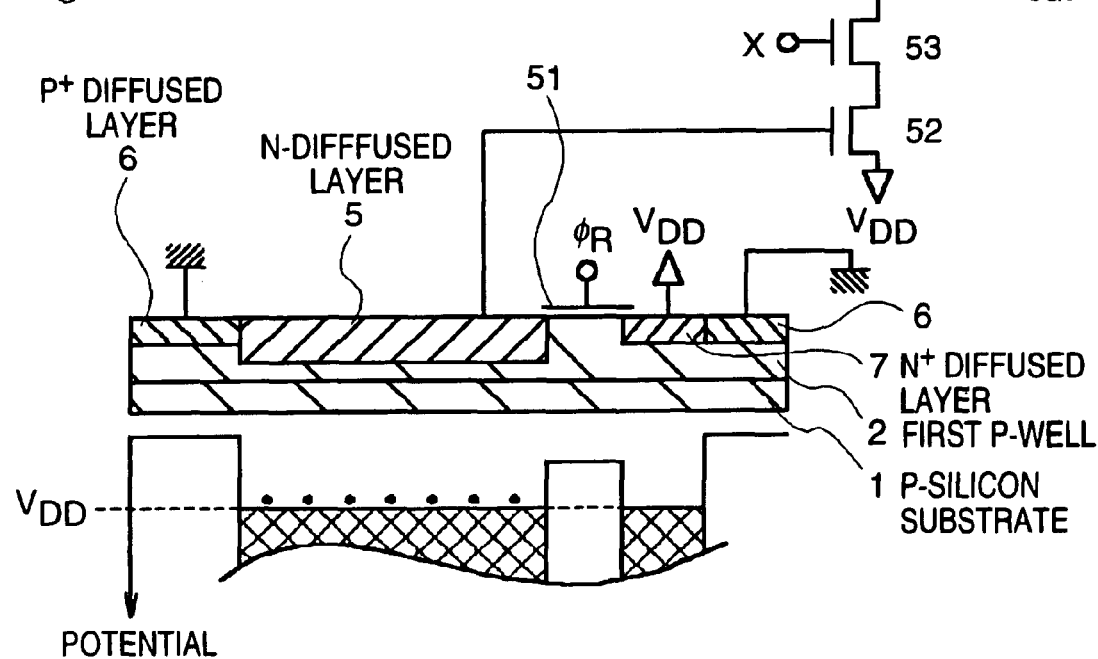

Referring to FIGS. 1A and 1B, there are shown diagrammatic partial sectional views of the solid state image sensor for illustrating a first embodiment of the method in accordance with the present invention for fabricating the solid state image sensor. In FIGS. 1A and 1B, elements corresponding to those shown in FIG. 3A are given the same reference numbers, and therefore, explanation will be omitted for simplification of the description.

The structure under an upper surface of the insulating film 13, which includes a protection film and interlayer insulator films for the gate electrode and the interconnection, is the same as that of the prior art example. After the insulating film 13 in the first prior art example shown in FIG. 3A is formed, a third metal interconnection 11 also functioning as a light blocking film having an opening 11A at a position corresponding to the N-type diffused layer 5, is formed on the upper surface of the insulating film 13. At this time, the bonding pad is not formed, differently from the first prior art example. Thereafter, an oxide film is deposited on the whole surface to have a thickness on the order of 4.5 $\mu$m, by means of a CVD process.

A through hole (not shown) for interconnecting a lower level interconnection is formed in the oxide film. Succeedingly, an interconnection groove 17 is formed on the oxide film in communication with the through hole, and then, filled with an aluminum film by means of a sputtering, and thereafter, a CMP (chemical mechanical polishing) process is carried out (generally called a damascene process) to polish the surface of the oxide film until the thickness of the oxide film becomes on the order of 4 $\mu$m, so that the polished oxide film constitutes a planarizing layer 14 having a planarized surface, and at the same time, a fourth level metal interconnection 12 functioning as a bonding pad is formed in the interconnection groove 17. Therefore, the upper surface of the planarizing layer 14 formed of the oxide film and an upper surface of the fourth metal interconnection 12 functioning as the bonding pad, are positioned at the same height.

Thereafter, a sintering is carried out at a temperature on the order of 450° C. for the purpose of activating a contacting portion between the metal interconnection and the diffused layer and the gate electrode, and also for the purpose of reducing an interface state between a silicon of the N-type diffused layer 5 (constituting the photodiode in the image sensor section) and an oxide film. This condition is shown in FIG. 1A.

Finally, a photosensitive polymer resin is coated on the surface of the planarizing layer 14 by the spin coating to have a thickness on the order of 2 μm, and is patterned by a photolithography, and then, softened by a heat treatment so as to form a micro lens 15 formed of the polymer resin, at a position corresponding to the N-type diffused layer 5. Thus, a first embodiment of the solid state image sensor in accordance with the present invention is obtained as shown in FIG. 1B.

In the first embodiment of the solid state image sensor in accordance with the present invention, since the upper surface of the planarizing layer 14 and the upper surface of the fourth metal interconnection 12 functioning as the bonding pad, are positioned at the same height, it is no longer necessary to remove a material on the bonding pad by a photolithography after the micro lens is formed, differently from the prior art example. Therefore, it is possible to avoid dissolution, deform and detachment of the micro lens, thereby to prevent a lowering of the production yield which would have otherwise been caused by the dissolution, deform and detachment of the micro lens in the prior art.

Figure 2A:
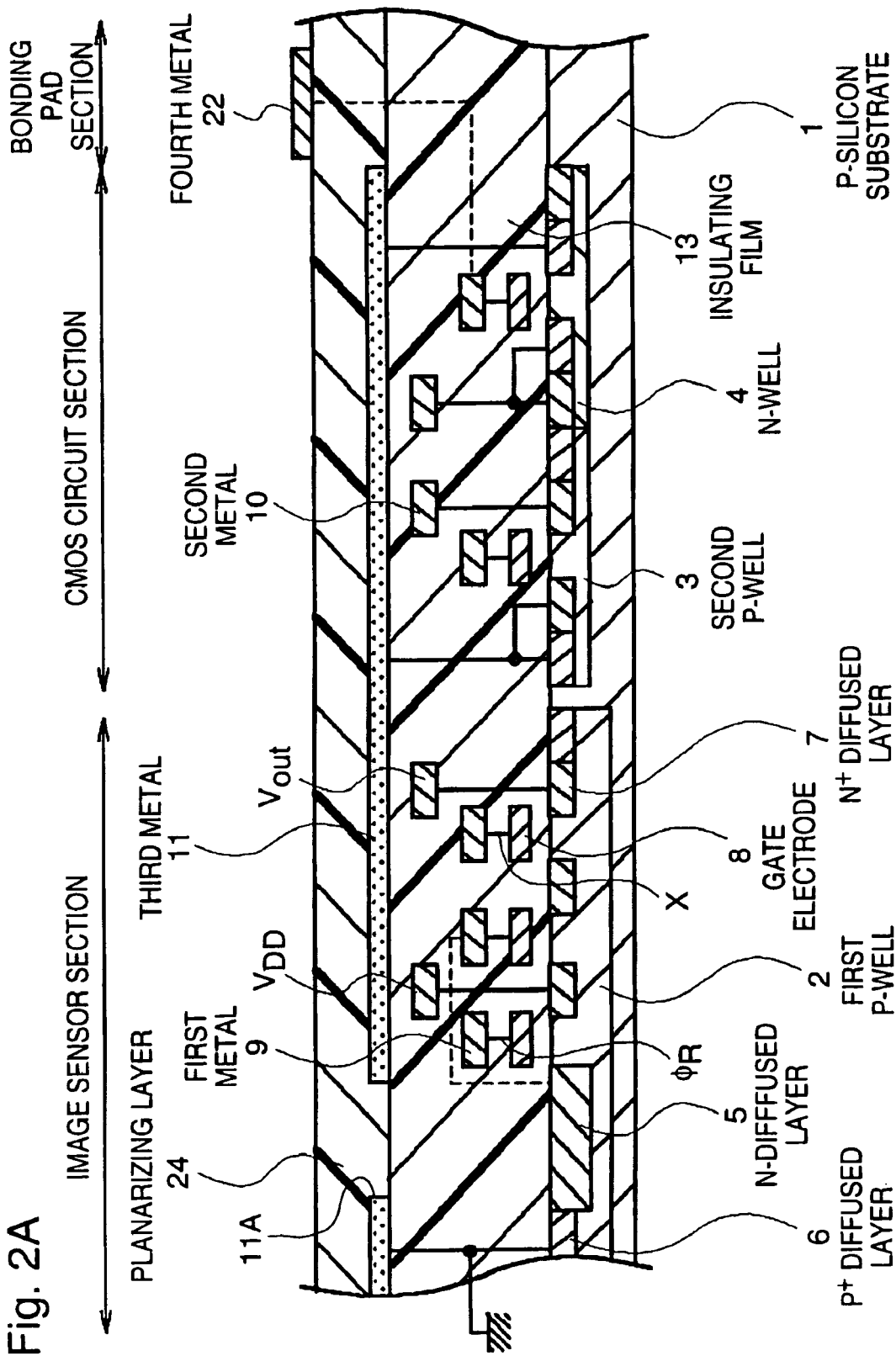
FIGS. 2A and 2B are diagrammatic partial sectional views of the solid state image sensor for illustrating a second embodiment of the method in accordance with the present invention for fabricating the solid state image sensor.
Figure 2B:
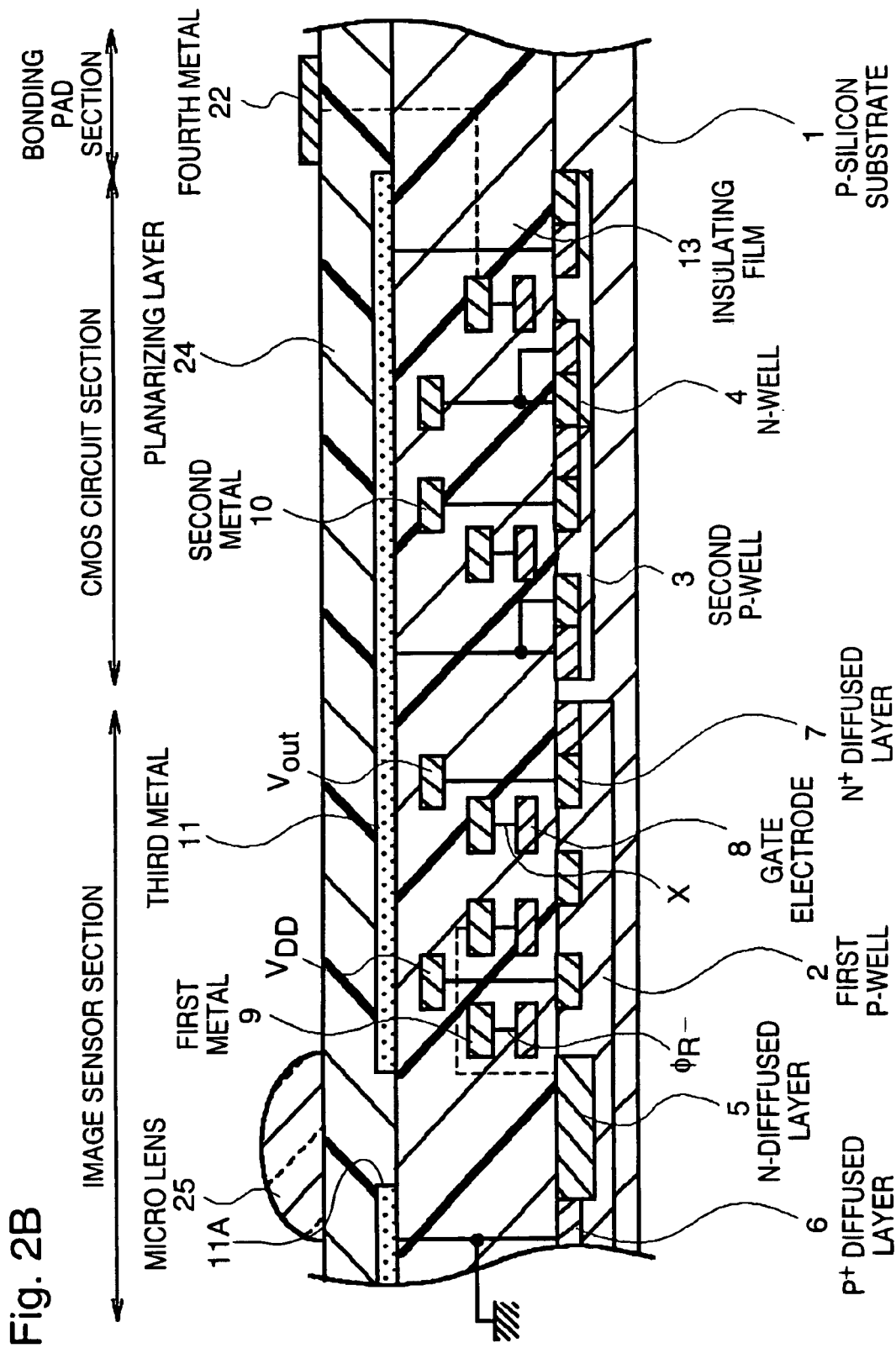

Referring to FIGS. 2A and 2B, there are shown diagrammatic partial sectional views of the solid state image sensor for illustrating a second embodiment of the method in accordance with the present invention for fabricating the solid state image sensor. In FIGS. 2A and 2B, elements corresponding to those shown in FIG. 3A and in FIGS. 1A and 1B are given the same reference numbers, and therefore, explanation will be omitted for simplification of the description.

The process until the third metal interconnection 11 functioning as the light blocking film is formed, is the same as the corresponding process in the first embodiment. Similarly to the first embodiment, after the third metal interconnection 11 functioning as the light blocking film having the opening 11A at a position corresponding to the N-type diffused layer 5, is formed on the upper surface of the insulating film 13, an oxide film is deposited on the whole surface to have a thickness on the order of 4.5 μm, by means of a CVD process.

Succeedingly, a CMP process is carried out to polish the surface of the oxide film until the thickness of the oxide film becomes on the order of 4 μm, so that the polished oxide film constitutes a planarizing layer 24 having a planarized surface. Furthermore, after a through hole (not shown) for interconnecting a lower level interconnection is formed, an aluminum film is deposited by a sputtering, and then patterned to form a fourth metal interconnection 22 functioning as a bonding pad, by use of a photolithography and an etching.

Thereafter, a sintering is carried out at a temperature on the order of 450° C. for the purpose of activating a contacting portion between the metal interconnection and the diffused layer and the gate electrode, and also for the purpose of reducing an interface state between a silicon of the N-type diffused layer 5 (constituting the photodiode in the image sensor section) and an oxide film. This condition is shown in FIG. 2A.

Finally, a photosensitive polymer resin is coated on the planarizing layer 24 by the spin coating to have a thickness on the order of 2 μm, and is patterned by a photolithography, and then, softened by a heat treatment so as to form a micro lens 25 formed of the polymer resin, at a position corresponding to the N-type diffused layer 5. Thus, a second embodiment of the solid state image sensor in accordance with the present invention is obtained as shown in FIG. 2B.

In the second embodiment of the solid state image sensor in accordance with the present invention, since the upper surface of the fourth metal interconnection 22 functioning as the bonding pad, is positioned at a level higher than that of the upper surface of the planarizing layer 24, it is no longer necessary to remove a material on the bonding pad by a photolithography after the micro lens is formed, differently from the prior art example. Therefore, it is possible to avoid dissolution, deform and detachment of the micro lens, thereby to prevent a lowering of the production yield which would have otherwise been caused by the dissolution, deform and detachment of the micro lens in the prior art.

The invention has thus been shown and described with reference to the specific embodiments. However, it should be noted that the present invention is in no way limited to the details of the illustrated structures but changes and modifications may be made within the scope of the appended claims. In the above mentioned embodiments, the light blocking film is formed directly under the planarizing film. However, for example, the light blocking film can be formed on any of interlayer insulator films which constitute the insulating film.

What is claimed is:

1. A method for fabricating a solid state image sensor, comprising:

preparing a substrate having devices including an image sensor section formed thereon;

forming an insulating film covering said devices and a light blocking film, said light blocking film positioned at a predetermined height in a range from a surface of said insulating film to a level above said insulating film, said light blocking film having an opening at a position corresponding to at least said image sensor section;

forming a planarizing film to cover said insulating film including said light blocking film;

forming a groove in a predetermined region of said planarizing film;

filling said groove with a bonding metal electrode;

planarizing the whole surface of said planarizing film including said bonding metal electrode; and forming a micro lens on said planarizing film at a position corresponding to said image sensor section.

2. A method for fabricating a solid state image sensor claimed in claim 1, wherein said filling up said bonding metal electrode in said groove and planarizing the whole surface of said planarizing film includes depositing a metal of said bonding metal electrode on said planarizing film, including said groove, and polishing said metal of said bonding metal electrode until said metal of said bonding metal electrode is removed from a surface of said planarizing film.

3. A method for fabricating a solid state image sensor claimed in claim 2, wherein a sintering is carried out after the filling of said groove with said bonding metal electrode but before the forming of said micro lens.

4. A method for fabricating a solid state image sensor claimed in claim 1, wherein a sintering is carried out after the filling of said groove with said bonding metal electrode but before the forming of said micro lens.

5. A method for fabricating a solid state image sensor, comprising:

preparing a substrate having devices including an image sensor section formed thereon;

forming an insulating film covering said devices and a light blocking film, said light blocking film positioned at a predetermined height in a range from a surface of said insulating film to a level above said insulating film, said light blocking film having an opening at a position corresponding to at least said image sensor section;

forming a planarizing film to cover said insulating film including said light blocking film;

forming a bonding metal electrode on a predetermined position of said planarizing film; and forming a micro lens on said planarizing film at a position corresponding to said image sensor section.

6. A method for fabricating a solid state image sensor claimed in claim 5, wherein a sintering is carried out after the forming of said bonding metal electrode but before the forming of said micro lens.

7. A method of fabricating a solid state image sensor, said method comprising:

forming a micro lens on a planarizing film at a position corresponding to an image sensor unit, said planarizing film covering a light blocking film and supporting a bonding metal electrode, wherein said bonding metal electrode is on a top surface of said planarizing film.

8. A method of fabricating a solid state image sensor, said method comprising:

forming a micro lens on a planarizing film at a position corresponding to an image sensor unit, said planarizing film covering a light blocking film and supporting a bonding metal electrode, wherein said bonding metal electrode is formed in a groove formed in said planarizing film.

9. A method of fabricating a solid state image sensor, said comprising:

forming a micro lens on a planarizing film at a position corresponding to an image sensor unit, said planarizing film covering a light blocking film and supporting a bonding metal electrode, wherein a sintering is carried out after said bonding metal electrode is formed but before said micro lens is formed.

10. A method of fabricating a solid state image sensor, comprising:

forming an image sensor region on a substrate;

forming at least one layer of metal interconnects to interconnect said image sensor to at least one other device formed on said substrate, said at least one layer of metal interconnects including a region serving as a light blocking film for said image sensor region, said at least one layer of metal interconnects separated from each other by a layer of insulating material;

forming a planarizing film over said insulating film;

using said planarizing film as a support for forming a bonding metal electrode; and subsequent to said forming said bonding metal electrode, forming a micro lens on said planarizing film at a position corresponding to said image sensor region, wherein said bonding metal electrode is on a top surface of said planarizing film.

11. A method of fabricating a solid state image sensor, comprising:

forming an image sensor region on a substrate;

forming at least one layer of metal interconnects to interconnect said image sensor to at least one other device formed on said substrate, said at least one layer of metal interconnects including a region serving as a light blocking film for said image sensor region, said at least one layer of metal interconnects separated from each other by a layer of insulating material;

forming a planarizing film over said insulating film;

using said planarizing film as a support for forming a bonding metal electrode; and subsequent to said forming said bonding metal electrode, forming a micro lens on said planarizing film at a position corresponding to said image sensor region, wherein said bonding metal electrode is formed in a groove formed in said planarizing film.

12. A method of fabricating a solid state image sensor, comprising:

forming an image sensor region on a substrate;

forming at least one layer of metal interconnects to interconnect said image sensor to at least one other device formed on said substrate, said at least one layer of metal interconnects including a region servicing as a light blocking film for said image sensor region, said at least one layer of metal interconnects separated from each other by a layer of insulating material;

forming a planarizing film over said insulating film;

using said planarizing film as a support for forming a bonding metal electrode; and subsequent to said forming said bonding metal electrode, forming a micro lens on said planarizing film at a position corresponding to said image sensor region, wherein a sintering is carried out after said bonding metal electrode is formed but before said micro lens is formed.

* * * * *